United States Patent
Thukkaram et al.

(10) Patent No.: US 12,428,723 B2
(45) Date of Patent: Sep. 30, 2025

(54) METHOD OF FORMING A LAYER COMPRISING MAGNESIUM, ALUMINUM, AND ZINC, AND RELATED SOLIDS AND SYSTEMS

(71) Applicant: ASM IP Holding B.V., Almere (NL)

(72) Inventors: Monica Thukkaram, Ghent (BE); Aditya Chauhan, Ottignies-Louvain-la-Neuve (BE); Andrea Illiberi, Leuven (BE); Vivek Koladi Mootheri, Leuven (BE); Leo Lukose, Leuven (BE); Alessandra Leonhardt, Sipoo (FI); Michael Eugene Givens, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 31 days.

(21) Appl. No.: 18/535,440

(22) Filed: Dec. 11, 2023

(65) Prior Publication Data
US 2024/0191347 A1    Jun. 13, 2024

Related U.S. Application Data

(60) Provisional application No. 63/387,198, filed on Dec. 13, 2022.

(51) Int. Cl.
*C23C 16/40* (2006.01)
*C23C 16/455* (2006.01)

(52) U.S. Cl.
CPC .......... *C23C 16/407* (2013.01); *C23C 16/403* (2013.01); *C23C 16/45527* (2013.01); *C23C 16/45553* (2013.01)

(58) Field of Classification Search
CPC ............... C23C 16/407; C23C 16/403; C23C 16/45527; C23C 16/45553
See application file for complete search history.

(56) References Cited

U.S. PATENT DOCUMENTS

| | | | |
|---|---|---|---|
| 6,727,592 B1* | 4/2004 | Woo | H01L 21/76868 257/761 |
| 7,972,876 B2 | 7/2011 | Chen | |
| 9,643,144 B2* | 5/2017 | Xu | B22F 1/18 |
| 2007/0036892 A1* | 2/2007 | Haukka | C23C 16/0218 257/E21.171 |

(Continued)

FOREIGN PATENT DOCUMENTS

CN    104152868 B    12/2016

OTHER PUBLICATIONS

Gancarz, T., et al., "Physicochemical properties of Al, Al—Mg and Al—Mg—Zn alloys". Journal of Molecular Liquids 249 (2018) 470-476.*

(Continued)

*Primary Examiner* — Bret P Chen
(74) *Attorney, Agent, or Firm* — Banner & Witcoff, Ltd.

(57) ABSTRACT

Methods and related solids and systems are described. In some embodiments, methods as described herein can comprise executing a plurality of super cycles. Ones from the plurality of super cycles can comprise a magnesium sub cycle, an aluminum sub cycle, and a zinc sub cycle. At least one super cycle can comprise more than one magnesium sub cycle, aluminum sub cycle, or zinc sub cycle. Thus, layers having a tunable magnesium, aluminum, or zinc composition can be formed.

16 Claims, 2 Drawing Sheets

(56) References Cited

U.S. PATENT DOCUMENTS

Figure 1:
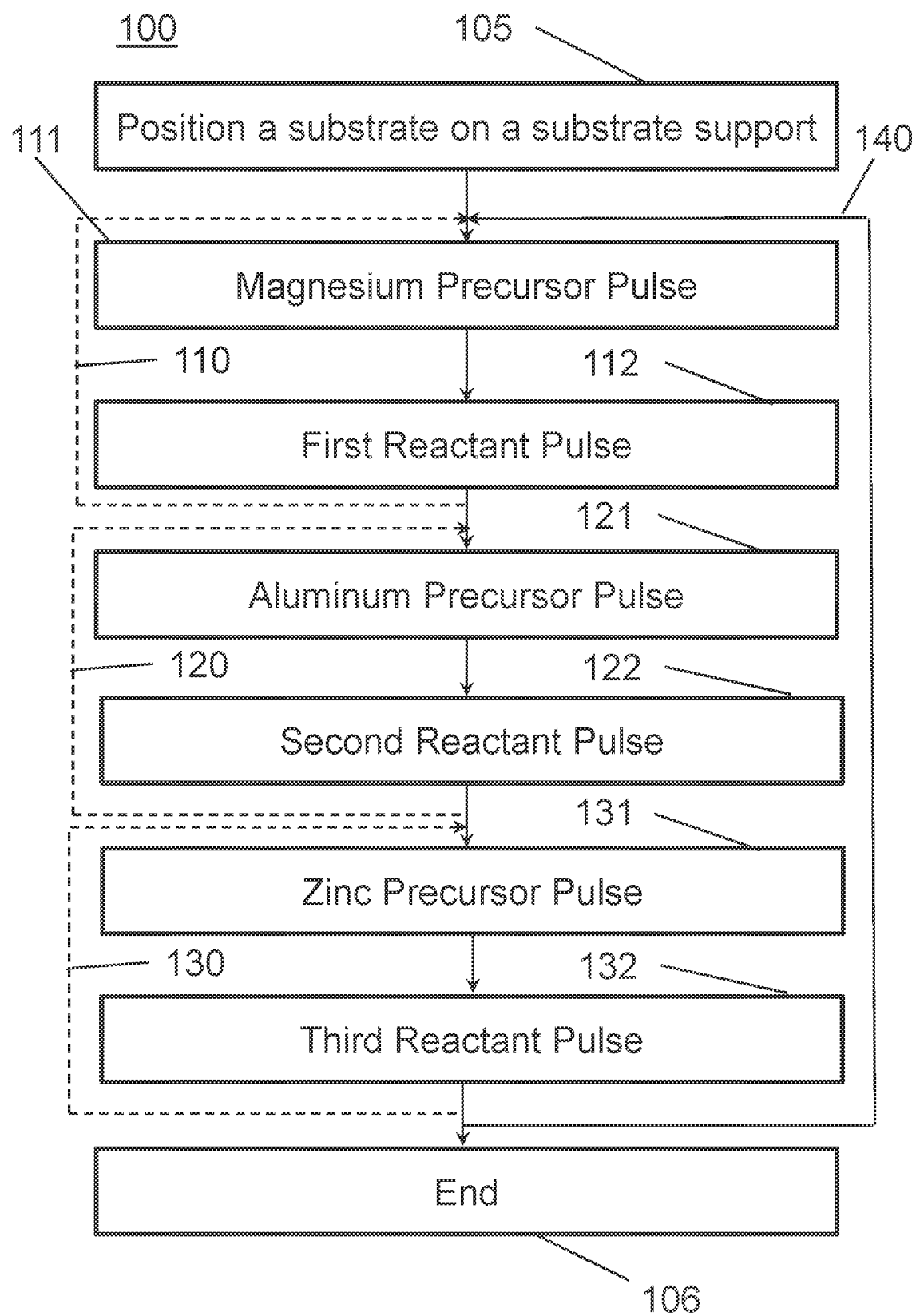

| | | | | |
|---|---|---|---|---|
| 2008/0015578 | A1* | 1/2008 | Erickson | A61L 31/16 606/281 |
| 2008/0223287 | A1* | 9/2008 | Lavoie | H01L 21/28562 117/94 |
| 2009/0305458 | A1* | 12/2009 | Hunks | C07F 7/10 438/102 |
| 2012/0177837 | A1* | 7/2012 | Eckert | C23C 4/11 427/446 |
| 2014/0231930 | A1* | 8/2014 | Weidman | H01L 21/76871 438/785 |
| 2016/0190368 | A1* | 6/2016 | Cao | H10F 10/16 136/255 |
| 2019/0058157 | A1* | 2/2019 | Choi | H10K 50/844 |

OTHER PUBLICATIONS

Rehman, Ubaid Ur, et al., "Tailoring thermoelectric properties of ALD grown ZnO thin films: Effect of Al/Mg doping and post-annealing treatment". Materials Chemistry and Physics 333 (2025) 130344, pp. 1-8.*

Effect of co-doping process on topography, optical and electrical properties of ZnO nanostructured, R. Mohamed et al, AIP Conf. Proc. 1963, 020028 (2018).

Investigating the MgAl-Doping n-Type ZnO(MgAlZnO) Metal Oxide Film Used as the ITO Cathode Buffer Layer in the Inverted Polymer Solar Cell, Chen et al, 2020 IEEE 3rd International Conference on Electronics Technology.

Robust Transparent and Conductive Gas Diffusion Multibarrier Based on Mg- and Al-Doped ZnO as Indium Tin Oxide-Free Electrodes for Organic Electronics, Kwon et al, ACS Appl. Mater. Interfaces 2018, 10, 32387-32396.

Tailoring Bandgap and Electrical Properties of Magnesium-Doped Aluminum Zinc Oxide Films Deposited by Reactive Sputtering Using Metallic Mg and Al—Zn Targets, Yang et al, Coatings 2020, 10, 708; doi:10.3390/coatings 10080708.

The effect magnesium (Mg) on structural and optical properties of ZnO:Mg thin film by sol-gel spin coating method, Nurdin Siregar et al 2020 J. Phys.: Conf. Ser. 1428 012026.

Undercoordinated indium as an intrinsic electron-trap center in amorphous InGaZnO4, Nahm et al, NPG Asia Materials (2014) 6, e143; doi: 10.1038/am.2014.103; published online Nov. 14, 2014.

* cited by examiner

METHOD OF FORMING A LAYER COMPRISING MAGNESIUM, ALUMINUM, AND ZINC, AND RELATED SOLIDS AND SYSTEMS

CROSS-REFERENCE TO RELATED APPLICATION(S)

This Application claims the benefit of U.S. Provisional Application 63/387,198 filed on Dec. 13, 2022, the entire contents of which are incorporated herein by reference.

FIELD OF INVENTION

The present disclosure is in the field of semiconducting oxides and methods of their manufacture.

BACKGROUND OF THE DISCLOSURE

Indium tin oxide is a semiconducting oxide which is used in a variety of contexts for one or more of its semiconducting and transparent properties. However, indium tin oxide poorly withstands hydrogen, which limits the contexts in which it can be successfully integrated in devices. Therefore, there is a need for other semiconducting oxide materials which can be more easily integrated in devices.

SUMMARY OF THE DISCLOSURE

Described herein are methods for forming materials, such as layers comprising a material, such as a layer comprising magnesium, aluminum, and zinc. Methods as described herein advantageously employ cyclical deposition processes such as atomic layer deposition. Advantageously, methods as described herein allow conformal deposition on patterned substrates comprising three-dimensional features such as gaps, recesses, and even reentrant features. Also, the presently disclosed methods advantageously provide forming materials with improved compositional control.

In some embodiments, a method as described herein comprises providing a substrate to a reaction chamber; executing a cyclical deposition process, the cyclical deposition process comprising a plurality of super cycles, ones from the plurality of super cycles comprising a magnesium sub cycle comprising a magnesium precursor pulse and a first reactant pulse, the magnesium precursor pulse comprising providing a magnesium precursor comprising magnesium, and the first reactant pulse comprising providing a first reactant; an aluminum sub cycle comprising an aluminum precursor pulse and a second reactant pulse, the aluminum precursor pulse comprising providing an aluminum precursor comprising aluminum, and the second reactant pulse comprising providing a second reactant; and, a zinc sub cycle comprising a zinc precursor pulse and a third reactant pulse, the zinc precursor pulse comprising providing a zinc precursor comprising zinc, and the third reactant pulse comprising providing a third reactant; and, at least one super cycle comprises at least two magnesium sub cycles, aluminum sub cycles, or zinc sub cycles; thereby forming a layer comprising aluminum, zinc, and magnesium on the substrate.

In some embodiments, at least one super cycle comprises at least two magnesium sub cycles.

In some embodiments, at least one super cycle comprises one and only one aluminum sub cycle.

In some embodiments, at least one super cycle comprises at least two zinc sub cycles.

In some embodiments, the number of magnesium sub cycles in a super cycle divided by the number of zinc sub cycles in the super cycle equals a magnesium-zinc sub cycle ratio, and the magnesium-zinc sub cycle ratio is from at least 0.2 to at most 2.0.

In some embodiments, the number of magnesium sub cycles in a super cycle divided by the number of aluminum sub cycles in the super cycle equals a magnesium-aluminum sub cycle ratio, and the magnesium-aluminum sub cycle ratio is from at least 4 to at most 7.

In some embodiments, the number of zinc sub cycles in a super cycle divided by the number of aluminum sub cycles in the super cycles equals a zinc-aluminum sub cycle ratio, and the zinc-aluminum sub cycle ratio is from at least 4 to at most 7.

In some embodiments, the layer comprising aluminum, zinc, and magnesium has a magnesium concentration, a zinc concentration, and an aluminum concentration, wherein the magnesium concentration is 4 times higher than the aluminum concentration, and the zinc concentration is five times higher than the aluminum concentration.

In some embodiments, the substrate comprises a dielectric layer, a metal nitride layer, or a conductive oxide; and the layer comprising aluminum, zinc, and magnesium is formed on the dielectric layer, the metal nitride layer, or the conductive oxide.

In some embodiments, at least one of the first reactant, the second reactant, and the third reactant comprises oxygen.

In some embodiments, the layer comprising aluminum, zinc, and magnesium further comprises oxygen.

In some embodiments, the layer comprises $MgO$, $ZnO_2$, and $Al_2O_3$.

In some embodiments, the aluminum precursor comprises an aluminum(III) alkyl.

In some embodiments, the magnesium precursor comprises a magnesium(II) pi-complex.

In some embodiments, the layer comprising magnesium, aluminum, and zinc comprises a semiconductor.

In some embodiments, a method as described herein further comprises a step of annealing the substrate after the layer comprising aluminum, zinc, and magnesium has been formed on the substrate.

Further described herein is a solid comprising magnesium, zinc, aluminum, and oxygen and having a magnesium concentration, a zinc concentration, and an aluminum concentration, wherein the magnesium concentration is 4 times higher than the aluminum concentration, and wherein the zinc concentration is five times higher than the aluminum concentration.

In some embodiments, the solid contains substantially no hydrogen.

In some embodiments, the solid contains substantially no carbon.

Further described herein is a system comprising a substrate handling system, a reaction chamber, a zinc precursor source, an aluminum precursor source, a magnesium precursor source, a reactant source, and a controller, wherein the controller is programmed for causing the system to carry out a method as described herein.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

FIG. 1 describes an embodiment of a method (100) that can be employed for forming a layer on a substrate.

Figure 2:
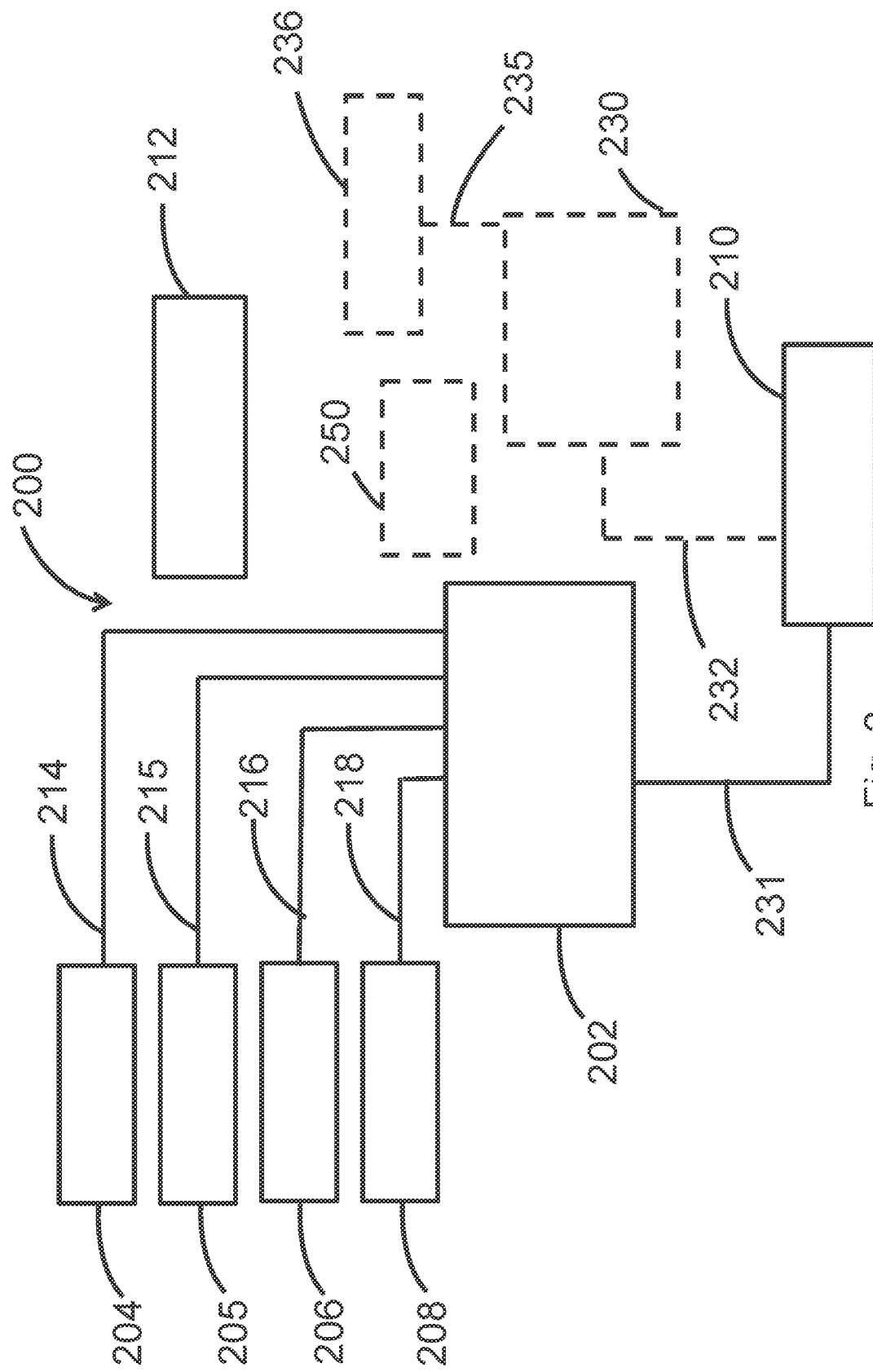

FIG. 2 shows an embodiment of a system (200) as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include helium, argon, and any combination thereof.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous.

The term "deposition process" as used herein can refer to the introduction of precursors (and/or reactants) into a reaction chamber to deposit a layer over a substrate. "Cyclical deposition processes" are examples of "deposition processes".

The term "cyclical deposition process" can refer to a sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. A cyclical deposition process may or may not comprise self-limiting surface reactions.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reactor chamber in between two pulses of gasses which react with each other. For example, a purge, e.g. using nitrogen gas, may be provided between a precursor pulse and a reactant pulse, thus avoiding or at least minimizing gas phase interactions between the precursor and the reactant. It shall be understood that a purge can be effected either in time or in space, or both. For example, in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example, in the case of spatial purges, a purge step can take the following form: moving a substrate from a first location to which a first precursor is continually supplied, through a purge gas curtain, to a second location to which a second precursor is continually supplied.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

With reference to FIG. 1, described herein is an embodiment of a method (100) that can be employed for forming a semiconducting layer on a substrate. The semiconducting layer comprises zinc, magnesium, and aluminum.

A method (100) as described herein can comprise a step (105) of providing a substrate to a reaction chamber.

A method (100) as described herein further comprises executing a cyclical deposition process. The cyclical deposition process comprises a plurality of super cycles (140). Ones from the plurality of super cycles (140), i.e. individual super cycles (140), comprise a magnesium sub cycle (110), an aluminum sub cycle (120), and a zinc sub cycle (130). At least one super cycle (140) comprises at least two magnesium sub cycles (110), two aluminum sub cycles (120), or two zinc sub cycles (130). In some embodiments, all or substantially all super cycles (140) comprise at least two magnesium sub cycles (110), aluminum sub cycles (120), or zinc sub cycles (130). In some embodiments, at least one super cycle (140) such as substantially all or all super cycles (140), comprise m magnesium sub cycles (110), an aluminum sub cycles, and z zinc sub cycles, wherein m, a, and z are integers. In some embodiments, m and z are numbers which are independently selected from an integer from at least 2 to at most 20, or from an integer from at least 5 to at most 15. In some embodiments, a equals 1. In some embodiments, and during at least one of the super cycles (140), at least one of the magnesium sub cycle (110), the aluminum sub cycle (120), and the zinc sub cycle (130) is repeated at least once.

Within a given super cycle (140), one or more magnesium sub cycles (110), one or more aluminum sub cycles (120), and one or more zinc sub cycles (130) can be carried out in any order. As shown in FIG. 1, the magnesium sub cycles (110) precede the aluminum sub cycles (120), which in turn precede the zinc sub cycles (130). Of course, other orders are possible. For example, the aluminum sub cycles (120) may precede the zinc sub cycles (130) which may precede the magnesium sub cycles (110).

In some embodiments, the m magnesium sub cycles are executed consecutively, without any intervening aluminum or zinc sub cycles. In some embodiments, consecutive magnesium sub cycles are separated by a purge.

In some embodiments, the aluminum sub cycles are executed consecutively, without any intervening magnesium or zinc sub cycles. In some embodiments, consecutive aluminum sub cycles are separated by a purge.

In some embodiments, the z zinc sub cycles are executed consecutively, without any intervening aluminum or magnesium sub cycles. In some embodiments, consecutive zinc sub cycles are separated by a purge.

In some embodiments, a super cycle may comprise an irregular order of sub cycles. For example, a super cycle may comprise executing m/2 magnesium sub cycles, then a/3 aluminum sub cycles, then z zinc sub cycles, then m/2 magnesium sub cycles, and then 2a/3 aluminum sub cycles.

Thus, after a pre-determined number of super cycles (140) has been executed, the method ends (106) a layer comprising aluminum, zinc, and magnesium is formed on the substrate. In some embodiments, the layer comprising aluminum, zinc, and magnesium is a semiconductor. In some embodiments, the layer comprising aluminum, zinc, and magnesium comprises a semiconductor.

The magnesium sub cycle (110) comprises a magnesium precursor pulse (111) and a first reactant pulse (112). The magnesium precursor pulse (111) comprises providing a magnesium precursor. The magnesium precursor can be provided, for example, to the reaction chamber. Thus, the substrate can be contacted with the magnesium precursor. The first reactant pulse (112) comprises providing a first reactant. The first reactant can be provided, for example, to the reaction chamber. Thus, the substrate can be contacted with the first reactant.

The aluminum sub cycle (120) comprises an aluminum precursor pulse (121) and a second reactant pulse (122). The aluminum precursor pulse (121) comprises providing an aluminum precursor. The aluminum precursor can be provided, for example, to the reaction chamber. Thus, the substrate can be contacted with the aluminum precursor. The second reactant pulse (122) comprises providing a second reactant. The second reactant can be provided, for example, to the reaction chamber. Thus, the substrate can be contacted with the second reactant.

The zinc sub cycle (130) comprises a zinc precursor pulse (131) and a third reactant pulse (132). The zinc precursor pulse (131) comprises providing a zinc precursor. The zinc precursor can be provided, for example, to the reaction chamber. Thus, the substrate can be contacted with the zinc precursor. The third reactant pulse (132) comprises providing a third reactant. The third reactant can be provided, for example, to the reaction chamber. Thus, the substrate can be contacted with the third reactant.

In some embodiments, at least one super cycle comprises at least two magnesium sub cycles. In some embodiments, at least one super cycle comprises from at least two to at most 40 magnesium sub cycles, or from at least 5 to at most 20 magnesium sub cycles, or from at least 10 to at most 15 magnesium sub cycles.

In some embodiments, at least one super cycle comprises one and only one aluminum sub cycle. In other words, and in some embodiments, at least one super cycle comprises one and no more than one aluminum sub cycle.

In some embodiments, at least one super cycle comprises at least two aluminum sub cycles.

In some embodiments, at least one super cycle comprises at least two zinc sub cycles. In some embodiments, at least one super cycle comprises from at least two to at most 40 zinc sub cycles, or from at least 5 to at most 20 zinc sub cycles, or from at least 10 to at most 15 zinc sub cycles.

In some embodiments, the number of magnesium sub cycles in a super cycle divided by the number of zinc sub cycles in the super cycle equals a magnesium-zinc sub cycle ratio. The magnesium-zinc sub cycle ratio is from at least 0.2 to at most 5.0, or from at least 0.5 to at most 2.0, or from at least 0.8 to at most 1.2. In some embodiments, the magnesium-zinc sub cycle ratio is from at least 0.2 to at most 2.0.

In some embodiments, the number of magnesium sub cycles in a super cycle divided by the number of aluminum sub cycles in the super cycle equals a magnesium-aluminum sub cycle ratio. The magnesium-aluminum sub cycle ratio can be from at least 0.2 to at most 20, or from at least 1 to at most 10, or from at least 4 to at most 7.

In some embodiments, the number of zinc sub cycles in a super cycle divided by the number of aluminum sub cycles in the super cycles equals a zinc-aluminum sub cycle ratio. The zinc-aluminum sub cycle ratio can be from at least 0.2 to at most 20, or from at least 1 to at most 10, or from at least 4 to at most 7.

In some embodiments, at least one of the first reactant, the second reactant, and the third reactant comprises an oxygen reactant. The oxygen reactant comprises oxygen. Accordingly, in some embodiments, the layer comprising aluminum, zinc, and magnesium further comprises oxygen. Suitable oxygen reactants include $O_2$, $O_3$, $H_2O$, $H_2O_2$, $N_2O$, NO, and $NO_2$.

In some embodiments, at least one of the first reactant, the second reactant, and the third reactant comprises a carbon reactant such as $CH_3$.

In some embodiments, at least one of the first reactant, the second reactant, and the third reactant comprises a nitrogen reactant such as $NH_3$.

In some embodiments, at least one of the first reactant, the second reactant, and the third reactant comprises a sulfur reactant such as $H_2S$.

In some embodiments, at least one of the first reactant, the second reactant, and the third reactant comprises a selenium reactant such as $H_2Se$.

In some embodiments, at least one of the first reactant, the second reactant, and the third reactant comprises a tellurium reactant such as $H_2Te$.

In some embodiments, the first reactant, the second reactant, and the third reactant are identical.

In some embodiments, the first reactant, the second reactant, and the third reactant comprise an oxygen reactant.

In some embodiments, the first reactant, the second reactant, and the third reactant comprise $H_2O$.

In some embodiments, the aluminum precursor comprises an aluminum(III) alkyl. Suitable aluminum(III) alkyls include trimethylaluminum, triethylaluminum, and tripropylaluminum.

In some embodiments, the magnesium precursor comprises a magnesium(II) pi-complex. In some embodiments, the magnesium precursor comprises one or more cyclopentadienyl ligands. In some embodiments, the magnesium precursor comprises bis(cyclopentadienyl)magnesium(II).

In some embodiments, the zinc precursor comprises a zinc(II) alkyl. Suitable zinc(II)alkyls include dimethylzinc, diethylzinc, and dipropylzinc.

Any suitable pulse time and precursor dose can be employed.

In some embodiments, all precursors are provided in a dose that leads to surface saturation during the corresponding an ALD pulse, such a pulse is also named a saturated pulse. In other words, precursor chemisorption has been given the chance to reach chemical equilibrium on the substrate surface, and no more precursor chemisorbs even when the substrate continues to be exposed to precursor.

This notwithstanding, and in some embodiments, one or more precursors may be provided in an undersaturated pulse. During an undersaturated pulse, precursor is provided in a dose that does not lead to surface saturation. In other words, in an undersaturated pulse, precursor chemisorption has not been given the chance to reach chemical equilibrium on the substrate surface, and if after an undersaturated pulse, the surface would continue to be exposed to precursor, more precursor would chemisorb on the substrate.

In some embodiments, the magnesium precursor is provided in an undersaturated pulse, the aluminum precursor is provided in a saturated pulse, and the zinc precursor is provided in a saturated pulse.

In some embodiments, the magnesium precursor is provided in a saturated pulse, the aluminum precursor is provided in an undersaturated pulse, and the zinc precursor is provided in a saturated pulse.

In some embodiments, the magnesium precursor is provided in a saturated pulse, the aluminum precursor is provided in a saturated pulse, and the zinc precursor is provided in an undersaturated pulse.

In some embodiments, the magnesium precursor is provided in a saturated pulse, the aluminum precursor is provided in an undersaturated pulse, and the zinc precursor is provided in an undersaturated pulse.

In some embodiments, the magnesium precursor is provided in an undersaturated pulse, the aluminum precursor is provided in a saturated pulse, and the zinc precursor is provided in an undersaturated pulse.

In some embodiments, the magnesium precursor is provided in an undersaturated pulse, the aluminum precursor is provided in an undersaturated pulse, and the zinc precursor is provided in a saturated pulse.

In some embodiments, the magnesium precursor is provided in an undersaturated pulse, the aluminum precursor is provided in an undersaturated pulse, and the zinc precursor is provided in an undersaturated pulse.

Accordingly, by controlling the degree of saturation and undersaturation, the incorporation of magnesium, aluminum, and zinc in the resulting layer or material can be efficiently controlled.

In some embodiments, the aluminum precursor pulses can last from at least 0.1 seconds to at most 5.0 seconds, or from at least 0.2 seconds to at most 2 seconds, or from at least 0.5 seconds to at most 1 seconds.

In some embodiments, the second reactant pulses can last from at least 0.1 seconds to at most 5.0 seconds, or from at least 0.2 seconds to at most 2 seconds, or from at least 0.5 seconds to at most 1.5 seconds.

In some embodiments, ones from the aluminum precursor pulses can be followed by a purge that may last for any suitable duration, for example from at least 0.5 to at most 10 seconds, or from at least 1 to at most 5 seconds.

In some embodiments, ones from the second reactant pulses can be followed by a purge that may last for any suitable duration, for example from at least 0.5 to at most 10 seconds, or from at least 1 to at most 5 seconds.

In some embodiments, the magnesium precursor pulses can last from at least 0.1 seconds to at most 20 seconds, or from at least 0.5 seconds to at most 15 seconds, or from at least 1 second to at most 10 seconds.

In some embodiments, the first reactant pulses can last from at least 0.1 seconds to at most 10 seconds, or from at least 0.2 seconds to at most 5 seconds, or from at least 0.5 second to at most 2 seconds.

In some embodiments, ones from the magnesium precursor pulses can be followed by a purge that may last for any suitable duration, for example from at least 0.5 to at most 20 seconds, or from at least 5 to at most 10 seconds.

In some embodiments, ones from the first reactant pulses can be followed by a purge that may last for any suitable duration, for example from at least 0.5 to at most 20 seconds, or from at least 5 to at most 10 seconds.

In some embodiments, the zinc precursor pulses can last from at least 0.1 seconds to at most 5 seconds, or from at least 0.2 seconds to at most 2 seconds, or from at least 0.3 second to at most 1.0 seconds.

In some embodiments, the third reactant pulses can last from at least 0.1 seconds to at most 10 seconds, or from at least 0.2 seconds to at most 5 seconds, or from at least 0.3 second to at most 1 seconds.

In some embodiments, ones from the magnesium precursor pulses can be followed by a purge that may last for any suitable duration, for example from at least 0.5 to at most 10 seconds, or from at least 1 to at most 5 seconds.

In some embodiments, ones from the third reactant pulses can be followed by a purge that may last for any suitable duration, for example from at least 0.5 to at most 20 seconds, or from at least 5 to at most 10 seconds.

A method as described herein is employed for forming a layer on a substrate.

In some embodiments, the substrate comprises a dielectric layer, a metal nitride layer, or a conductive oxide layer, and the layer comprising aluminum, zinc, and magnesium is formed on the dielectric layer, the metal nitride layer, or the conductive oxide layer.

In some embodiments, the substrate comprises a metal nitride layer and the layer comprising aluminum, zinc, and magnesium is formed on the metal nitride layer. Suitable metal nitride layers can comprise a metal nitride such as a transition metal nitride such as titanium nitride or niobium nitride.

In some embodiments, the substrate comprises a conductive oxide layer and the layer comprising aluminum, zinc, and magnesium is formed on the conductive oxide layer. Suitable conductive oxide layers can comprise an oxide such as indium oxide or zinc oxide.

In some embodiments, the substrate a dielectric layer on which the layer comprising aluminum, zinc, and magnesium is formed. Suitable dielectric layers include high-k dielectric layers, silicon oxide, silicon nitride, silicon oxycarbide, silicon oxycarbonitride, and others. Suitable high-k dielectric layers include aluminum oxide, hafnium oxide, zirconium oxide. The dielectric layers can also include oxides of other metals, semi-metals, semiconductors and their suitable combinations (doping, interfacial, multilayer etc). In some embodiments, the dielectric layer comprises one or more oxides of one or more elements selected from the list consisting of Li, Be, Na, Mg, Ca, Sc, Ti, V, Cr, Mn, Fe, Co, Ni, Cu, Zn, Al, Ga, Sr, Y, Zr, Nb, Mo, Ru, Cd, In, Sn, Sb, Ba, La, Hf, Ta, W, Ph, and Bi.

In some embodiments, during the cyclical deposition process, the substrate is maintained at a temperature of at least 180 to at most 300° ° C., or at a temperature of at least 200 to at most 250° C.

In some embodiments, during the cyclical deposition process, the reaction chamber is maintained at a pressure of at least 250 to at most 700 Pa.

A method as described herein can be advantageously employed for forming a layer comprising aluminum, zinc, and magnesium. The layer comprising aluminum, zinc, and magnesium has a magnesium concentration, a zinc concentration, and an aluminum concentration. In some embodiments, the magnesium concentration is 4 times higher than the aluminum concentration and the zinc concentration is five times higher than the aluminum concentration.

In some embodiments, the layer comprising magnesium, aluminum, and zinc comprises a mixture of $MgO$, $ZnO_2$, and $Al_2O_3$.

In some embodiments, a method as described herein further comprises a step of annealing the substrate after the layer comprising aluminum, zinc, and magnesium has been formed on the substrate.

In some embodiments, a further annealing step is carried out at a temperature of at least 350° C. and at most 450° C., for a duration of at least 15 minutes and at most 30 minutes, in an $N_2$ ambient. As an alternative to an $N_2$ ambient, other inert or substantially inert gasses can be used. Suitable annealing gasses include noble gasses such as He, Ne, Ar, Kr, and Xe. In some embodiments, $N_2$ can be mixed with one or more other gasses, such as one or more noble gasses.

A method as described herein can be employed for forming valuable and useful materials, in particular solids. In some embodiments, the solid is amorphous. In some embodiments, the solid is polycrystalline. In some embodiments, the solid is microcrystalline. I some embodiments, the solid is multicrystalline. In some embodiments, the solid is monocrystalline. Thus, further described herein is a solid that comprises magnesium, zinc, aluminum, and optionally oxygen. In some embodiments, the solid consists, or substantially consists, of magnesium, aluminum, zinc, and oxygen. The solid has a magnesium concentration, a zinc concentration, and an aluminum concentration. In some embodiments, the magnesium concentration is from at least 3 times higher to at most 5 times higher, for example 4 times higher than the aluminum concentration, and the zinc concentration is from at least 3 times to at most 6 times, for example five times higher than the aluminum concentration.

Advantageously, a solid as described herein can have a carbon concentration which is less than 2.0, 1.0, or 0.5 atomic percent, as measured by Elastic recoil detection (ERD), X-ray photoemission spectroscopy (XPS), and X-ray fluorescence (XRF). In some embodiments, a solid as described herein can contain no or substantially no carbon.

Advantageously, a solid as described herein can have a hydrogen concentration which is less than 5.0, 2.0, 1.0, 0.5, 0.2, or 0.1 atomic percent as measured by Elastic recoil detection (ERD). In some embodiments, a solid as described herein can contain no or substantially no hydrogen.

In some embodiments, a solid as described herein has a magnesium concentration of 45 atomic percent, a zinc concentration of 45 atomic percent, and an aluminum concentration of 10 atomic percent, as measured by x-ray fluorescence (XRF), excluding the concentration of oxygen, carbon, or hydrogen.

In some embodiments, a solid as described herein has a magnesium concentration of at least 30 atomic percent to at most 60 atomic percent, or of at least 40 atomic percent to at most 50 atomic percent, as measured by XRF.

In some embodiments, a solid as described herein has a zinc concentration of at least 30 atomic percent to at most 60 atomic percent, or of at least 40 atomic percent to at most 50 atomic percent, as measured by XRF.

In some embodiments, a solid as described herein has an aluminum concentration of at least 1 atomic percent to at most 20 atomic percent, or of at least 5 atomic percent to at most 15 atomic percent, as measured by XRF.

In some embodiments, a solid as described herein has zinc content of 45 to 55 or 50 atomic percent, a magnesium content of 35 to 45 or 40 atomic percent, and an aluminum content of 5 to 15 or 10 atomic percent, as measured by XRF A method as described herein can be executed in any suitable system. For example, a suitable system can comprise a substrate handling system, a reaction chamber a zinc precursor source, an aluminum precursor source, a magnesium precursor source, a reactant source, and a controller. The controller can be programmed for causing the system to carry out a method as described herein.

Now referring to FIG. 2, an embodiment of a system (200) is described. The system (200) comprises one or more reactor chambers (202). The system (200) further comprises a magnesium precursor storage module (205), an aluminum precursor storage module (206), a zinc precursor storage module (207), and a reactant storage module (208). The group magnesium precursor storage module (205) comprises a magnesium precursor. The aluminum precursor storage module (206) comprises an aluminum precursor. The zinc precursor storage module (208) comprises a zinc precursor. The reactant storage module (208) comprises a reactant such as a first reactant, a second reactant, or a third reactant as described herein. In some embodiments (not shown), the system can comprise several reactant storage modules, such as a first reactant storage module comprising a first reactant, a second reactant storage module comprising a second reactant, and a third reactant storage module comprising a third reactant.

The system further comprises an exhaust (210) for venting reactants and excess precursor from the one or more reaction chambers. In some embodiments, the system (200) further comprises a controller (212). The controller (212) can be configured to provide various gasses such as precursors and carrier gasses to the one or more reaction chambers in a cyclical deposition process as described herein.

The system (200) of FIG. 2 can be used to perform a method as described herein and/or form a structure or device portion as described herein.

The reaction chamber (202) can include any suitable reaction chamber, such as an ALD reaction chamber.

The gas sources (205)-(208) can be coupled to the reaction chamber (202) via lines (215)-(218): a magnesium precursor line (215), an aluminum precursor line (216), a zinc precursor line (217), and a reactant line (218). The lines (215-218) can each include flow controllers, valves, heaters, and the like. Optionally, the system can include any suitable number of additional gas sources. Optionally, the system can further describe a purge gas source (not shown in FIG. 2) which includes one or more inert gases, such as noble gasses, as described herein.

Exhaust (210) can include one or more vacuum pumps.

Optionally, the system (200) further comprises an annealing chamber (230) constructed and arranged for annealing a substrate. The annealing chamber (230) can be operationally connected to an annealing gas source (236) by means of an annealing gas line (235). The annealing gas source (236) comprises an annealing gas such as nitrogen, or a mixture of nitrogen and oxygen. In some embodiments, annealing is carried out in a vacuum, i.e. without providing an annealing gas to the annealing chamber (230), and optionally while pumping the annealing chamber down. The annealing chamber (230) is further operationally connected to the exhaust (210) by means of an annealing chamber exhaust line (232) such that the annealing chamber (230) can be vented when needed.

The system (200) can further comprise an optional wafer transfer chamber (250). The wafer transfer chamber (250) can comprise a segmented robot arm (not shown) or another actuator for transporting a wafer, e.g. a 300 mm monocrystalline silicon wafer, to the reaction chamber (202) and from the reaction chamber (202) to the annealing chamber (230).

Controller (212) includes electronic circuitry including a processor, and software to selectively operate valves, manifolds, heaters, pumps and other components included in the system (200). Such circuitry and components operate to introduce precursors, reactants, and optionally purge gases from the respective sources (204)-(208). The controller (212) can control timing of gas pulse sequences, temperature of the substrate and/or reaction chamber (202), temperature of the annealing chamber (230), pressure within the reaction chamber (202), pressure within the annealing chamber (230), and various other operations to provide proper operation of the system (200).

The controller (212) can include control software to electrically or pneumatically control valves to control flow of precursors, reactants and purge gases into and out of the reaction chamber (202), and into and out of the annealing chamber (230). Controller (112) can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the control system and be configured to execute one or more processes.

It will be appreciated that there are many arrangements of valves, conduits, precursor sources, and purge gas sources that may be used to accomplish the goal of feeding gases into the reaction chamber (202) and optionally into the annealing chamber (230). Further, as a schematic representation of a system, many components have been omitted for simplicity of illustration, and such components may include, for example, various valves, manifolds, purifiers, heaters, containers, vents, and/or bypasses.

During operation of reactor system (200), substrates, such as semiconductor wafers (not illustrated), are transferred from, e.g., a substrate handling system such as wafer transfer chamber (250) to reaction chamber (202) and optionally to the annealing chamber (230). Once the substrate(s) are transferred to the reaction chamber (202) or to the annealing chamber (230), one or more gases from the gas sources (205-208,236), such as precursors, reactants, carrier gases, annealing gasses and/or purge gases, are introduced into the reaction chamber (202) or the annealing chamber.

In some embodiments, a process as described herein is a thermal process, i.e. a process that does not comprise generating a plasma for forming active species such as ions or radicals to form a layer such as a semiconducting layer. This notwithstanding, in some embodiments, a process as described herein can comprise generating a plasma for forming active species such as ions or radicals to form a layer such as a semiconducting layer. In other words, in some embodiments, a method as described herein can be a plasma-enhanced deposition method. Thus, in some embodiments, one or more pulses can comprise generating a plasma.

The plasma can be a remote plasma, a direct plasma, or an indirect plasmas, all of which are as such known in the Art. Suitably, a direct plasma can be generated between a substrate support and a showerhead injector that is constructed and arranged for providing process gasses such as precursors and reactants to the reaction chamber.

In some embodiments, the magnesium pulse comprises generating a plasma. In some embodiments, the first reactant pulse comprises generating a plasma. In some embodiments, the aluminum pulse comprises generating a plasma. In some embodiments, the second reactant pulse comprises generating a plasma. In some embodiments, the zinc pulse comprises generating a plasma. In some embodiments, the third reactant pulse comprises generating a plasma.

Referring back to FIG. 1, an exemplary embodiment of a method as described herein is described. In this exemplary embodiment, the magnesium precursor can be bis(cyclopentadienyl)magnesium(II), the aluminum precursor can be trimethylaluminum, and the zinc precursor can be diethylzinc. Water can be used as each of the first reactant, the second reactant, and the third reactant. The method may comprise executing five super cycles. The magnesium precursor pulse can last 6 seconds, the magnesium precursor pulse can be followed by a purge which can last 8 seconds. The first reactant pulse can last 1 second. The first reactant pulse can be followed by a purge which can last 8 seconds. The aluminum precursor pulse can last 0.8 seconds. The aluminum precursor pulse can be followed by a purge that can last 2 seconds. The second reactant pulse can last 1 second. The second reactant pulse can be followed by a purge that lasts 8 seconds. The Zinc precursor pulse can last 0.4 seconds. The Zinc precursor pulse can be followed by a purge that can last 2 seconds. The third reactant pulse can last 0.5 second. The third reactant pulse can be followed by a purge that lasts 8 seconds. Exemplary numbers of sub cycles can include 12 zinc sub cycles, 12 magnesium sub cycles, and 2 aluminum sub cycles. During the cyclical deposition process, the substrate can be maintained at a temperature of 225° C. Advantageously, such a process can yield a growth rate of 3.0 nm per master cycle, and a within-wafer non-uniformity of <1% on a 300 mm monocrystalline silicon wafer with native oxide of less than one percent. Advantageously, the resulting layer has a carbon content of less than 0.5 atomic % as measured by x-ray fluorescence (XRF), and Elastic recoil detection (ERD)). It shall be noted that XRF cannot measure the concentration of hydrogen. Therefore, any XRF-derived concentrations reported herein exclude the content of, hydrogen. Advantageously, the hydrogen content of the resulting layer was less than 2.0 atomic percent as measured by ERD. Advantageously, the resulting layer has an aluminum content of 10 atomic percent, a zinc content of 45 atomic percent, and a magnesium content of 45 atomic percent, as measured by X-ray fluorescence (XRF), wherein the measurement excludes the content of oxygen and hydrogen.

The resulting layer was amorphous in the as-deposited state and stayed amorphous after an anneal in N2 at 900° C. The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method comprising
providing a substrate to a reaction chamber;
executing a cyclical deposition process, the cyclical deposition process comprising a plurality of super cycles, ones from the plurality of super cycles comprising
a magnesium sub cycle comprising a magnesium precursor pulse and a first reactant pulse, the magnesium precursor pulse comprising providing a magnesium precursor comprising magnesium, and the first reactant pulse comprising providing a first reactant;
an aluminum sub cycle comprising an aluminum precursor pulse and a second reactant pulse, the aluminum precursor pulse comprising providing an aluminum precursor comprising aluminum, and the second reactant pulse comprising providing a second reactant; and,
a zinc sub cycle comprising a zinc precursor pulse and a third reactant pulse, the zinc precursor pulse comprising providing a zinc precursor comprising zinc, and the third reactant pulse comprising providing a third reactant,
wherein at least one super cycle comprises at least two magnesium sub cycles, aluminum sub cycles, or zinc sub cycles, and
thereby forming a layer comprising aluminum, zinc, and magnesium on the substrate.

2. The method according to claim 1, wherein at least one super cycle comprises at least two magnesium sub cycles.

3. The method according to claim 1, wherein at least one super cycle comprises one and only one aluminum sub cycle.

4. The method according to claim 1, wherein at least one super cycle comprises at least two zinc sub cycles.

5. The method according to claim 1, wherein a number of magnesium sub cycles in a super cycle divided by a number of zinc sub cycles in the super cycle equals a magnesium-zinc sub cycle ratio, and wherein the magnesium-zinc sub cycle ratio is from at least 0.2 to at most 2.0.

6. The method according to claim 1, wherein a number of magnesium sub cycles in a super cycle divided by a number of aluminum sub cycles in the super cycle equals a magnesium-aluminum sub cycle ratio, and wherein the magnesium-aluminum sub cycle ratio is from at least 4 to at most 7.

7. The method according to claim 1, wherein a number of zinc sub cycles in a super cycle divided by a number of aluminum sub cycles in the super cycles equals a zinc-aluminum sub cycle ratio, and wherein the zinc-aluminum sub cycle ratio is from at least 4 to at most 7.

8. A method according to claim 1, wherein the layer comprising aluminum, zinc, and magnesium has a magnesium concentration, a zinc concentration, and an aluminum concentration, wherein the magnesium concentration is 4 times higher than the aluminum concentration, and wherein the zinc concentration is five times higher than the aluminum concentration.

9. The method according to claim 1, wherein the substrate comprises a dielectric layer, a metal nitride layer, or a conductive oxide; and wherein the layer comprising aluminum, zinc, and magnesium is formed on the dielectric layer, the metal nitride layer, or the conductive oxide.

10. The method according to claim 1, wherein at least one of the first reactant, the second reactant, and the third reactant comprises oxygen.

11. The method according to claim 10, wherein the layer comprising aluminum, zinc, and magnesium further comprises oxygen.

12. The method according to claim 11, wherein the layer comprises $MgO$, $ZnO_2$, and $Al_2O_3$.

13. The method according to claim 1, wherein the aluminum precursor comprises an aluminum(III) alkyl.

14. The method according to claim 1, wherein the magnesium precursor comprises a magnesium(II) pi-complex.

15. The method according to claim 1, wherein the layer comprising magnesium, aluminum, and zinc comprises a semiconductor.

16. The method according to claim 1, further comprising a step of annealing the substrate after the layer comprising aluminum, zinc, and magnesium has been formed on the substrate.

* * * * *